United States Patent [19]

Shinohara

[11] Patent Number: 5,286,439
[45] Date of Patent: Feb. 15, 1994

[54] PACKAGING FOR SEMICONDUCTORS

[75] Inventor: Hironobu Shinohara, Machida, Japan

[73] Assignee: Japan Synthetic Rubber Co., Ltd., Tokyo, Japan

[21] Appl. No.: 990,744

[22] Filed: Dec. 15, 1992

[51] Int. Cl.⁵ .................. B29C 45/14; C08F 232/00
[52] U.S. Cl. ..................... 264/272.15; 264/272.17; 525/326.1; 525/338; 526/281; 526/284; 427/58; 428/457
[58] Field of Search ............... 264/272.15, 272.17; 427/58, 133; 525/326.1, 338; 526/281, 284; 425/122

[56] References Cited

U.S. PATENT DOCUMENTS 5,164,469  11/1992  Goto et al. ..................... 526/281

FOREIGN PATENT DOCUMENTS 105610  5/1987  Japan .
106963  5/1991  Japan .

*Primary Examiner*—Paul R. Michl
*Assistant Examiner*—Tae H. Yoon
*Attorney, Agent, or Firm*—Oblon, Spivak, McClelland, Maier & Neustadt

[57] ABSTRACT

Semiconductor chips are packaged by injection molding while continuously feeding a lead frame, characterized by using for the injection molding a hydrogenated polymer (A) obtained by the hydrogenation of a polymer obtained by ring-opening polymerization of a specific norbornene derivative or a monomer mixture comprising said norbornene derivative and other monomer copolymerizable therewith, wherein said injection molding for the packaging is carried out under the conditions of a resin temperature in the range of 280° C. to 360° C.; the molding temperature in the range of Tg −80° C. to Tg +10° C., wherein Tg is the glass transition temperature of the hydrogenated polymer (A) is Tg; and the injection pressure in the range of 10 to 200 kgf/cm².

6 Claims, No Drawings

PACKAGING FOR SEMICONDUCTORS

BACKGROUND OF THE INVENTION

1. Field of the Invention

The present invention relates to a packaging method for sealing a semiconductor chip and to a packaged chip prepared by such method.

2. Description of the Background Art

Conventionally, thermosetting resins, such as epoxy resins, silicone resins, urethane resins, or the like, are used as sealing materials for semiconductor chips used in electronic parts. They are thus useful resins for effecting such operations as potting, sealing, coating, transfer molding methods, or the like.

However, the difficulty with using conventional sealing materials is that thermosetting resins require a preliminary precuring which lengthens the curing time and requires a two step process involving postcuring. In an attempt to solve this problem, the prior art has suggested using thermoplastic resins, instead of thermosetting resins, and direct injection molding of the thermoplastic into a mold containing the semiconductor.

Reference is made to the methods disclosed, for example, in Japanese Laid Open Patent Application Nos. 248546/1989, 75662/1990, 31451/1988, 106963/1991, U.S. Pat. No. 5,110,861, which all refer to the use of thermoplastic resins instead of thermosetting resins. However, the thermoplastic resins proposed by this prior art have proven to be insufficient. For instance, the use of polyphenylene sulfide, liquid crystal polymers, or similar thermoplastic resins, have the drawback that they are not particularly adherent to the lead frames frequently used in electronic devices, so that fillers are needed to improve adhesiveness. Unfortunately, however, while adhesiveness is improved by the use of fillers, flowability is impaired. To avoid this problem, smaller molecular weight resins must be used, but this, in turn, lowers the strength of the resin. In addition, fillers render the resins opaque and thus interfere with its usefulness as a sealant, which requires good light transmissivity.

In Japanese Patent Laid-open (Kokai) No. 31451/1988 there is disclosed a light-emitting diode which uses an olefinic polymer having an alicyclic structure as a thermoplastic resin. But here again, adhesiveness to the lead frame is a particular problem. Moreover, the use of such resins have the additional problem of possessing inadequate resin heat resistance which cannot withstand the temperatures of soldering, so that the resin often fails during processing of the semiconductor into the electronic device.

Japanese Patent Laid-open (Kokai) No. 105610/1987 discloses another alternative method of sealing with a resin by the RIM formation using a resin formed from a norbornene monomer. The problem with such resins, again, is their inherent poor heat resistance.

Japanese Patent Laid-open (Kokai) No. 106963/1991 discloses still another attempt at solving the problem. In that reference an optical disk substrate is used as a hub into which a metal part is inserted. The insertion is accomplished using a molding resin composition comprising a hydrogenated norbornene ring-opened polymer and rubber. Again this type of resin fails to solve the problem noted above, since blends of resins and rubber are generally opaque and interfere with light transmissivity.

Both Japanese Patent Laid-open (Kokai) No. 72535/1989 and Japanese Patent Laid-open (Kokai) No. 30238/1981 disclose sealing of electronic parts using injection molded poly-4-methyl-1-pentene. However, polymers of 4-methyl-1pentene are characterized by poor adhesiveness to lead. Copolymers of 4-methyl-1-pentene with grafted unsaturated carboxylic acid will improve adhesion, but requires an additional polymerization step for the graft modification, thereby undesirably complicating the production process. Moreover, a consistently high quality product is difficult to achieve and requires simultaneously good purification and efficient grafting, thereby further complicating resin preparation.

The attempt to convert from a thermosetting resin to a thermoplastic resin for injection molding to reduce molding time has therefore not been successful. Either the alternative resin is characterized by insufficient heat resistance, or other poor heat characteristics, such as poor heat cyclability, or it is characterized by poor light transmission properties or poor long term reliability, or the like. Alternatively, such alternative resins have been unsuccessful since they are not easily molded without deformation of the connecting wires or without breakage of the semiconductor chips.

SUMMARY OF THE INVENTION

Accordingly, it is one object of the present invention to provide a suitable method for the packaging of semiconductor chips, which will not cause semiconductor chip damage or deformation of the connecting wires during molding, and yet will produce a package of superior heat properties, light transmittance, long term reliability, and good adhesion to the lead frames.

It is also an object of the present invention to provide a suitably packaged semiconductor chip of superior properties.

This and other objects of the invention as will hereinafter be discussed have been achieved by use of a polymer obtained by the hydrogenated use of certain polymers which were first patented by the present assignee in Goto et al, U.S. Pat. No. 5,164,469. These polymers are prepared by ring opening polymerization of polymers (i) at least one norbornene derivative represented by the following formula (I):

wherein A, B and X are respectively hydrogen or alkyl containing 1 to 10 carbon atoms; Y is a group—$(CH_2)_n COOR^1$ or a group—$(CH_2)_n OCOR^1$, wherein $R^1$ is alkyl containing 1 to 20 carbon atoms and n is 0 or an integer of 1–10; or by the use of (ii) a monomer mixture comprising at least one of said norbornene derivatives (I) and another monomer which is copolymerizable therewith.

The tetracyclododecene (I) desirably is substituted with a polar group for Y in order to ensure good adhesion to the lead frame. This polar group is preferably a carbonate group represented by formula—$(CH_2)_n COOR^1$ which ensures a high glass transition temperature of the resulting hydrogenated polymer. It is particularly desirable that one molecule of the tetracyclododecene derivative represented by said formula (I) contain one polar substitution group made up of said carbonate group for assuring a low moisture absorptivity of the resulting hydrogenated polymer while maintaining the high heat resistance.

In addition, it is preferable if n is a smaller number since the smaller the number, the higher will be the glass transition temperature of the resulting polymer. It is also preferable that the $R^1$ alkyl group contain as high a number of carbon atoms as possible, since the higher the number, the lower will be the moisture absorptivity of the resulting polymer. On the other hand, it is desirable to have as low a carbon number as possible for $R^1$, to lower the glass transition temperature as much as possible. To achieve the ideal balance between these two desired characteristics, it is preferable that $R^1$ be a linear alkyl group with 1 to 4 carbon atoms or a polycyclic alkyl group with 5 or more carbon atoms, with particularly preferred groups being methyl, ethyl or cyclohexyl. Most preferred are the methyl or ethyl groups, because they are readily synthesized. The hydrogenated polymers used in the present invention are fully disclosed in Applicants' earlier U.S. Pat. No. 5,164,469, Goto et al in which the technique for polymerization and hydrogenation are fully disclosed.

Preferred monomers which can be used within formula (I) is 5-carboxymethylbicyclo[2.2.1]hepto-2-en,
5-methyl-5-carboxymethylbicyclo[2.2.1]hepto-2-en,
8-carboxymethyltetracyclo[4.4.0.1$^{2.5}$.1$^{7.10}$]-3-dodecene,
8-carboxyethyl-tetracyclo[4.4.0.1$^{2.5}$.1$^{7.10}$]-3-dodecene,
8-carboxy-n-propyltetracyclo[4.4.0.1$^{2.5}$.1$^{7.10}$]-3-dodecene,
8-carboxyisopropyltetracyclo[4.4.0.1$^{2.5}$.1$^{7.10}$]-3-dodecene,
8-carboxy-n-butyltetracyclo[4.4.0.1$^{2.5}$.1$^{7.10}$]-3-dodecene,
8-methyl-8-carboxymethyltetracyclo[4.4.0.1$^{2.5}$.1$^{7.10}$]-3-dodecene,
8-methyl-8-carboxyethyltetracyclo[4.4.0.1$^{2.5}$.1$^{7.10}$]-3-dodecene,
8-methyl-8-carboxy-n-propyltetracyclo[4.4.0.1$^{2.5}$.1$^{7.10}$]-3-dodecene,
8-methyl-8-carboxyisopropyltetracyclo[4.4.0.1$^{2.5}$.1$^{7.10}$]-3-dodecene,
8-methyl-8-carboxy-n-butyltetracyclo[4.4.0.1$^{2.5}$.1$^{7.10}$]-3-dodecene, and the like.

Among these, 8-methyl-8-carboxymethyltetracyclo[4.4.0.1$^{2.5}$.1$^{7.10}$]-3-dodecene is preferable because when this material is subjected to ring-opening polymerization the resulting polymer has a high glass transition temperature and low moisture absorptivity.

The monomers may be homopolymers or copolymers formed from two or more monomers in ring-opening copolymerization.

It is desirable that the hydrogenated polymer have an intrinsic viscosity measured at 30° C. ([h]inh) in chloroform in the range of 0.3 to 1.5 dl/gm, with a particularly preferable range being 0.3 to 0.5 dl/gm, to prevent wire deformation during molding. A softening temperature of 90° C. to 200° C., and a glass transition temperature of 100° C. to 210° C. are preferable. In particular, a glass transition temperature of 150° C. to 210° C. is desirable from the aspect of resistance to heat deformation during soldering. The glass transition temperature is measured by a differential scanning calorimeter (DSC) in nitrogen atmosphere at a rate of temperature rise of 10° C. per minute.

It is preferred that the hydrogenated polymer has a weight average molecular weight of 5,000 to 1,000,000 and preferably 8,000 to 200,000 to provide adequate strength.

The degree of the hydrogenation in the hydrogenated polymer, measured at 60 MHz $^1$H-NMR is 50% or greater, more preferably 90% or greater, and most preferably 98% or greater. The higher the degree of hydrogenation, the more superior the stability in heat and light.

The gel content of the hydrogenated polymer used in the present invention is preferably 5 wt % or less, and more preferably 1 wt % or less.

As required, other thermoplastic resins can be blended into the hydrogenated polymer used in the present invention.

Additives such as stabilizers, antioxidants, lubricants, antistatic agents, ultraviolet absorbents, fluorescent whitening agents, plasticizers, mold release agents, coloring agents, flame retardants, and the like, as well as reinforcing agents such as quartz fiber, glass fiber, aromatic polyamide fiber, high strength, high elastic polyethylene fiber, alumina, zinc oxide, silicic acid compounds, titanic acid compounds, and the like, can be blended into the hydrogenated polymer to improve heat resistance.

Suitable flame retardants which can be blended in include bromine-containing compounds, such as tetrabromobisphenol-A, decabromodiphenyl oxide, hexabromocyclododecane, octabromodiphenyl ether, tetrabromodiphenyl ether, bistribromophenoxyethane, tribromophenol, ethylenebistetrabromophthalimide, and the like; chlorine-containing compounds, such as chlorinated paraffin, perchlorocyclopentadecane, chlorendo acid, and the like; phosphorus-containing compounds, including phosphates such as triphenylphosphine, and the like; halogen-containing phosphates, polyphosphates, and the like; as well as other inorganic compounds, such as antimony trioxide, aluminum hydroxide, and the like.

The phosphate compounds are preferable, and in particular, triphenylphosphine is most preferred for maintaining transparency.

The amount of additives are usually 0.01–50 parts by weight to 100 parts by weight of the specified hydrogenated polymer.

In the present invention, a semiconductor chip is packaged by injection molding of the above-mentioned specified hydrogenated polymer under specified conditions with continuous feeding of a lead frame. The particular conditions such as mold temperature, resin temperature, injection pressure, and the feeding of the lead frame on which the semiconductor chip is mounted for continuous molding, will depend upon the particular injection molding used. Specifically, the mold temperature can be Tg −80° C. to Tg +10° C., preferably Tg +50° C. to Tg +10° C., and more preferably Tg −50° C. to Tg 10° C. If the molding temperature is lower than Tg −80° C., wire deformation may occur; if Tg +10° C. or higher, it is difficult to remove the molded product from the mold without deformation.

The resin temperature during injection molding is in the range of 280° C. to 360° C., preferably 300° C. to 350° C., and more preferably 330° C. to 350° C.

If the resin temperature is less than 280° C., the flowability of the resin is impaired and wire deformation could be a problem.

If the resin temperature exceeds 360° C. the external appearance of the resulting molded goods deteriorates because of poor heat stability.

The injection pressure during filling of the mold is in the range of 10 to 200 kgf/cm$^2$, and preferably 10–50 kgf/cm$^2$.

If the injection pressure is less than 10 kgf/cm$^2$, molding distortion can be produced; if greater than 200 kgf/cm$^2$, the problems of chip breakage or wire deformation may occur.

Under the above-mentioned conditions, the molten viscosity of the specified hydrogenated polymer during molding is normally in the range of 100 to 2,000 poise, and preferably in the range of 200 to 1,000 poise.

If the molten viscosity is less than 100 poise, productivity is lowered; if greater than 2,000 poise, the problem of wire deformation may occur.

The lead wire, may be continuously fed by inserting a uniform length of lead frame into the mold by means of an insert device; or may be hoop formed, whereby single lengths of lead frame are fed in sequence.

The speed at which the lead frame is continuously supplied is normally adjusted to the molding speed.

The molding speed, i.e., the time for packaging one semiconductor chip, is usually 5 to 120 seconds, and preferably 10 to 60 seconds. The rate of strain during injection molding is normally $1 \times 10^2$ to $3 \times 10^4$/sec, preferably $4 \times 10^2$ to $2 \times 10^4$/sec, and more preferably $1 \times 10^3$ to $1 \times 10^4$/sec.

Here, the rate of strain is defined as the maximum rate of shearing strain at the nozzle section of the injection molding machine and depends on the amount of resin injected Q (ec/see) and the radius R of the nozzle (cm). This value is given by the following equation.

$$\gamma = 32Q/\pi R^3$$

The rate of strain ($\gamma$) is controlled by the injection speed, the injection pressure, and the shape and area of the gate.

When the rate of strain ($\gamma$) falls within the above-mentioned range, there is no deformation of the molded product and a superior external appearance is obtained.

The injection speed is normally 10 to 300 mm/see, preferably 20 to 200 mm/see, and more preferably 80 to 150 mm/sec. The radius of the nozzle is 0.5 to 3.0 mm, preferably 0.8 to 2.5 mm, and more preferably 1.4 to 2.0 mm. Injection molding normally can be carried out in air, but in order to prevent the decomposition of the thermoplastic resin and the creation of color and gel, the injection molding can take place in an atmosphere of nitrogen gas fed to the thermoplastic resin molding machine. In particular, when using a resin with a degree of low hydrogenation, it is preferable to supply the resin under an atmosphere of nitrogen gas.

In addition, if the time for cooling the mold is shorter than 2 seconds, there are cases in which the mechanical properties of the substrate deteriorate. If longer than 60 seconds, on the other hand, the cycle time is lengthened, which is undesirable for productivity.

The cooling time is preferably 2 to 30 seconds, and more preferably 2 to 20 seconds.

The present invention enables a number of advantageous effects including:

(1) Packaging of semiconductor chips can be carried out continuously, resulting in good productivity.

(2) Wiring deformation and cross-sectional breakage of the chip will not occur during packaging of the semiconductor.

(3) Cracking of the packaged semiconductor chips will not occur and corrosion of the aluminum wiring can be controlled even after a prolonged period, providing long-term reliability.

(4) The light transmittance of the package is good, making it ideal for the packaging of light-emitting diodes (LEDs).

Examples of electronic parts which can be packaged by, the method of the present invention include light-emitting diodes (visible light-emitting diodes, infrared light-emitting diodes, light-emitting diodes for photo communication), transistors, integrated circuits (ICs), phototransistors, EPROMs, photocouplers, photo interrupters, photo cyclisters, CCDs, and the like.

The present invention will now be explained with reference to the following specific examples, which are in no way limitative of the scope of the invention.

Parts and percentages given in the examples are by weight, unless otherwise designated. In addition, each type of measurement in the examples is as follows.

REFERENCE EXAMPLE 1

100 gm of 8-methyl-8-methoxycarbonyltetracyclo-[4.4.0.1$^{2.5}$.1$^{7.10}$]dodeca-3-en, 60 gm of 1,2-dimethoxyethane, 240 gm cyclohexane, 25 gm of 1-hexene, and 3.4 ml of a solution of 0.96 mol of diethylaluminum chloride in 1 mol of toluene were added to an autoclave of 1 liter volume.

In another flask, 20 ml of a solution of 0.05 mol of tungsten hexachloride in 1 mol of 1,2-dimethoxyethane and 10 ml of a solution of 0.1 mol of paraldehyde in 1 mol of 1,2-dimethoxyethane were mixed together.

4.9 ml of this mixed solution were added to the blended material in the autoclave. After firmly sealing, the mixture was heated 80° C. and agitated for 3 hours. A 2/8 (by weight) mixed solvent of 1,2-dimethoxyethane and cyclohexane was added to the resulting polymer solution to give a polymer/solvent ratio of 1 to 10 by weight, after which 20 gm of triethanolamine was added and the mixture was agitated for 10 minutes.

500 gm of methanol was added to this polymer solution, agitated for 30 min and allowed to stand. After the mixture had separated into two layers, the upper layer was removed and methanol was once again added with agitation and, after standing, the upper layer was removed. This operation was repeated twice, and the lower layer was suitably diluted with cyclohexane and 1,2-dimethoxyethane to provide a solution of the polymer in cyclohexane and 1,2-dimethoxyethane with the polymer concentration of 10%.

20 gm of palladium/silica magnesia (manufactured by Nikki Chemical Co., palladium content: 5 wt %) was added and the mixture in the autoclave was reacted for 4 hours at 165° C. under a hydrogen pressure of 40 kg/cm$^2$, after which the hydrogenation catalyst was removed by filtration and a solution of hydrogenated polymer was obtained.

Pentaerythrityl-tetraquis[3-(3,5-di-t-butyl-4-hydroxyphenyl)propionate, as an antioxidant, was added to this solution of the hydrogenated polymer in an amount of 0.1% of the polymer contained therein, followed by evaporation of the solvent under reduced pressure at 380° C.

The molten resin was then pelletized in an extrusion machine under an atmosphere of nitrogen, to obtain a hydrogenated polymer with an intrinsic viscosity of 0.5 dl/gm (30° C., in chloroform), a 99.5% degree of hydrogenation, and a glass transition temperature of 168° C.

REFERENCE EXAMPLE 2

The metathesis ring-opening polymerization was carried out in the same manner as in Reference Example 1, except that the amount of 1-hexene used was 30 g, and the polymer was hydrogenated and pelletized to obtain a hydrogenated polymer with an intrinsic viscosity of 0.40 dl/gm (30° C., in chloroform), a 99% degree of hydrogenation, and a glass transition temperature of 166° C.

REFERENCE EXAMPLE 3

After metathesis ring-opening polymerization of 6-ethylidene-2-tetracyclododecene in the same manner as for Reference Example 1, the polymer was hydrogenated and pelletized to give a thermoplastic resin with an intrinsic viscosity of 0.56 dl/gm (30° C., in chloroform), a 99% degree of hydrogenation, and a glass transition temperature of 140° C.

REFERENCE EXAMPLE 4

55 mol % of ethylene and 45 mol % of 2-methyl-1,4,5,8-dimethano-1,2,3,4,4a,5,8,8a-octahydronaphthalene were polymerized by the addition polymerization and pelletized to give a thermoplastic resin with an intrinsic viscosity of 0.64 dl/gm (35° C., in decalin), and a glass transition temperature of 140° C.

EXAMPLE 1

Light-emitting diode chips mounted on a metal lead frame were inserted continuously into a rotating-type injection mold, and the light-emitting diodes were sealed using the hydrogenated polymers obtained in Reference Example 1. The injection molding was carried out at resin temperature of 340° C., a mold temperature of 130° C., and an injection pressure of 100 kgf/cm$^2$. The molding time was 15–20 seconds.

The resulting light-emitting diodes adequately demonstrated the light-emitting diode function with no cutting of the semiconductor chip section or the wire.

The adherence and heat cycle characteristics of the resulting light-emitting diodes were tested by the following methods The results are given in Table 1.

EXAMPLE 2

Light-emitting diode chips mounted on a metal lead frame were inserted continuously into a rotating-type injection mold, and the light-emitting diodes were sealed using the hydrogenated polymers obtained in Reference Example 2. The injection molding was carried out at resin temperature of 320° C., a mold temperature of 140° C., and an injection pressure of 50 kgf/cm$^2$. The molding time was 15–20 seconds.

The resulting light-emitting diodes adequately demonstrated the light-emitting diode function with no cutting of the semiconductor chip section or the metal wire.

The adherence and heat cycle characteristics of the resulting light-emitting diodes were tested by the following methods: The results are given in Table 1.

ADHERENCE CHARACTERISTICS

The light-emitting diodes were left in an atmosphere of a temperature of 85° C. and a humidity of 85% for 72 hours (A) and 240 hours (B), to measure depth (mm) of water penetration into their package parts.

HEAT CYCLE CHARACTERISTICS

The light-emitting diodes were held for 30 minutes at a temperature of −30° C. then for 30 minutes at a temperature of 100° C. This cycle was repeated 10 times. The conditions of the passage of electricity were tested under a current of 30 mA and judged according to the following criteria:

Production of products (%) having unacceptable electric flow characteristic was determined.

MOISTURE RESISTANCE RELIABILITY

The light-emitting diodes were held for 1,000 hours at 65° C. and a relative humidity of 95%. The percentage of corrosion of the aluminum wiring was measured.

HEAT RESISTANCE

The light-emitting diodes were immersed for 30 seconds in a solder vessel in which the solder temperature was 260° C. to observe their external appearance.

Samples in which no swell, wrinkles, or cracks were observed at all: O

Samples in which any swell, wrinkles, cracks were observed: X

COMPARATIVE EXAMPLE 1

Light-emitting diodes were sealed using a polycarbonate as a sealant in place of the hydrogenated polymer, under the same conditions as in Example 1, with the exceptions that the temperature of the resin during injection molding was 310° C. and the mold temperature was 90° C.

The same tests were run on the light-emitting diodes as for Example 1. The results are given in Table 1.

COMPARATIVE EXAMPLE 2

Light-emitting diodes were sealed using the hydrogenated polymer obtained in Reference Example 3, under the same conditions as in Example 1.

The same tests were run on the light-emitting diodes as for Example 1. The results are given in Table 1.

COMPARATIVE EXAMPLE 3

Light-emitting diodes were sealed using the hydrogenated polymer obtained in Reference Example 4, under the same conditions as in Example 1.

The same tests were run on the light-emitting diodes as for Example 1. The results are given in Table 1.

COMPARATIVE EXAMPLE 4

Light-emitting diodes were sealed using the hydrogenated polymer obtained in Reference Example 1, with the injection molding carried out at a resin temperature of 250° C., a mold temperature of 80° C., and an injection pressure of 300 kgf/cm$^2$.

Cutting of the metal lead frame occurred in the resulting light-emitting diodes.

TABLE 1

| | Adherence (mm) | | Heat cycle character- | Moisture resistance reliability Corrosion | Heat |
| --- | --- | --- | --- | --- | --- |
| | A | B | istic | (%) | resistance |
| Example 1 | 0 | 0 | 0 | 0 | 0 |
| Example 2 | 0 | 0 | 0 | 0 | 0 |
| Comparative | 0.72 | 1.21 | 100 | 100 | X |

TABLE 1-continued

| | Adherence (mm) | | Heat cycle character- istic | Moisture resistance reliability Corrosion (%) | Heat resistance |
|---|---|---|---|---|---|
| | A | B | | | |
| Example 1 Comparative Example 2 | 0.21 | 0.50 | 0 | 10 | X |
| Comparative Example 3 | 0.55 | 0.78 | 55 | 100 | X |

COMPARATIVE EXAMPLE 5

Injection molding was performed using the hydrogenated polymer obtained in Reference Example 1 under the conditions of a resin temperature of 250° C., a mold temperature of 120° C., and an injection pressure of 50 kgf/cm².

Deformation in metal lead wires occurred in the resulting light emitting diodes.

COMPARATIVE EXAMPLE 6

Injection molding was performed using the hydrogenated polymer obtained in Reference Example 1 under the conditions of a resin temperature of 320° C., a mold temperature of 70° C., and an injection pressure of 50 kgf/cm².

Cracks were produced in the resulting light emitting diodes, thus no products which could be subjected to evaluation tests were obtained.

COMPARATIVE EXAMPLE 7

Injection molding was performed using the hydrogenated polymer obtained in Reference Example 1 under the conditions of a resin temperature of 320° C., a mold temperature of 120° C., and an injection pressure of 300 kgf/cm².

The resulting light emitting diodes had broken metal wires.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of packaging semiconductor chips by injection molding while continuously feeding a lead frame, characterized by using for the injection molding a hydrogenated polymer (A) obtained by the hydrogenation of a polymer obtained by ring-opening polymerization of (i) at least one norbornene derivative represented by the following formula (I),

wherein A and B are hydrogen atoms or hydrocarbon groups containing 1 to 10 carbon atoms; and X is a hydrogen atom or a hydrocarbon group containing 1 to 10 carbon atoms, Y is a group—$(CH_2)_n COOR^1$ or a group—$(CH_2)_n OCOR^1$, wherein $R^1$ is a hydrocarbon group containing 1 to 20 carbon atoms and n is 0 or an integer of 1–10; or (ii) a monomer mixture comprising at least one of said norbornene derivatives and other monomer copolymerizable therewith, wherein said injection molding for the packaging is carried out under the conditions of a resin temperature in the range of 280° C. to 360° C.; the molding temperature in the range of Tg $-80°$ C. to Tg $+10°$ C., wherein Tg is the glass transition temperature of the hydrogenated polymer (A) is Tg; and the injection pressure in the range of 10 to 200 kgf/cm².

2. A method of packaging semiconductor chips according to claim 1, wherein said hydrogenated polymer (A) is a hydrogenated polymer obtained by hydrogenation of a polymer obtained by ring-opening polymerization of 8-methyl-8-carboxymethyltetracyclo-[4.4.0.1$^{2.5}$,1$^{7.10}$]-3-dodecene.

3. A method of packaging semiconductor chips according to claim 1, wherein the resin temperature is in the range of 300° C. to 350° C.

4. A method of packaging semiconductor chips according to claim 1, wherein the molding temperature is in the range of Tg $-50°$ C. to Tg $+10°$ C.

5. A packaged semiconductor chip formed by injection molding of the chip into a lead frame, wherein the molding resin used is a hydrogenated polymer (A) obtained by the hydrogenation of a polymer obtained by ring-opening polymerization of (i) at least one norbornene derivative represented by the following formula (I),

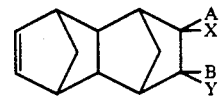

wherein A and B are hydrogen atoms or hydrocarbon groups containing 1 to 10 carbon atoms; and X is a hydrogen atom or a hydrocarbon group containing 1 to 10 carbon atoms, Y is a group—$(CH_2)_n COOR^1$ or a group—$(CH_2)_n OCOR^1$, wherein $R^1$ is a hydrocarbon group containing 1 to 20 carbon atoms and n is 0 or an integer of 1–10; or (ii) a monomer mixture comprising at least one of said norbornene derivatives and other monomer copolymerizable therewith.

6. The packaged semiconductor chip of claim 5 wherein said hydrogenated polymer (A) is a hydrogenated polymer obtained by hydrogenation of a polymer obtained by ring-opening polymerization of 8-methyl-8-carboxymethyltetracyclo-[4.4.0.1$^{2.5}$,1$^{7.10}$]-3-dodecene.

* * * * *